United States Patent [19]

Masaie

[11] 4,287,493
[45] Sep. 1, 1981

[54] PIEZOELECTRIC FILTER

[75] Inventor: Kimio Masaie, Kanazawa, Japan

[73] Assignee: Murata Manufacturing Co., Ltd., Japan

[21] Appl. No.: 113,449

[22] Filed: Jan. 21, 1980

[30] Foreign Application Priority Data

Jan. 25, 1979 [JP] Japan .................................. 54-7869
Aug. 7, 1979 [JP] Japan ............................... 54-100985

[51] Int. Cl.³ ..................... H03H 9/205; H03H 9/56; H03H 9/60
[52] U.S. Cl. .................................. 333/191; 333/189; 333/192
[58] Field of Search .............................. 333/187–192; 310/320, 321, 357, 365, 366

[56] References Cited

U.S. PATENT DOCUMENTS 3,593,219  7/1971  Tsuchiya .............................. 333/192
4,196,407  4/1980  Masaie et al. ........................ 333/191

Primary Examiner—Marvin L. Nussbaum
Attorney, Agent, or Firm—Ostrolenk, Faber, Gerb & Soffen

[57] ABSTRACT

A piezoelectric filter for use in electrical and electronic equipment which includes a substrate of piezoelectric material, and electrode members provided on first and second surfaces of the substrate so as to form at least one set of resonator including a multi-mode resonator and a single resonator of the thickness-vibration, energy-trapping type. The multi-mode resonator serves as a series resonance element of a ladder type filter through utilization of the oblique or anti-symmetrical mode resonance of the multi-mode resonator, while the single resonator is used as a parallel resonance element of the ladder type filter.

7 Claims, 12 Drawing Figures

PIEZOELECTRIC FILTER

BACKGROUND OF THE INVENTION

The present invention relates to an electrical bandpass filter and more particularly, to a piezoelectric filter of ladder type for use in electrical and electronic equipment which is constituted by a multi-mode resonator and a single resonator provided on a piezoelectric substrate.

Figure 1:
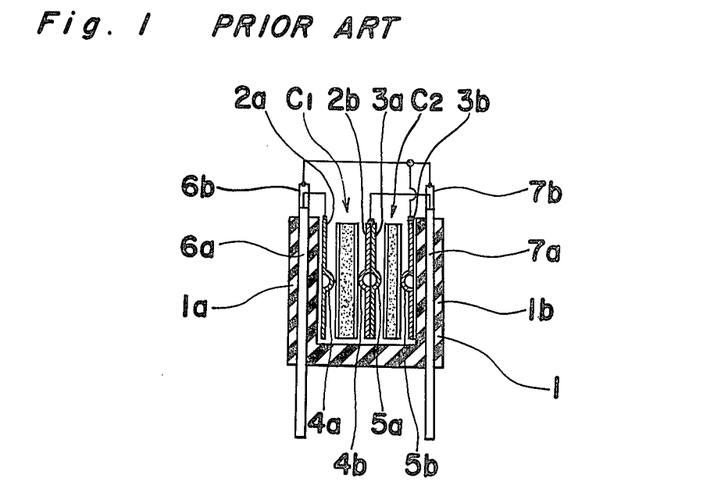
FIG. 1 is a schematic side sectional view showing the construction of a conventional piezoelectric filter (already referred to)
Figure 2:
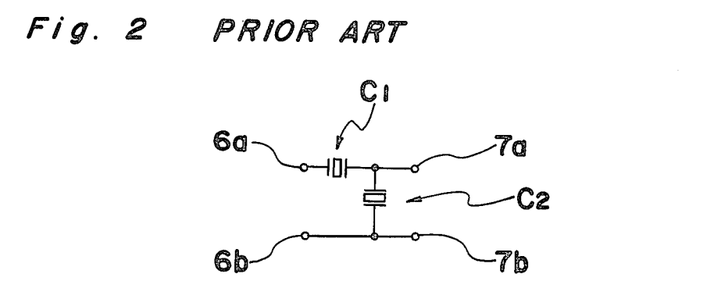
FIG. 2 is an electrical circuit diagram of the piezoelectric filter of FIG. 1 (already referred to)

Conventionally, there has been known a piezoelectric filter of ladder type having a construction, for example, as shown in FIG. 1 which includes a housing 1 molded with electrically insulative resin material to have a generally U-shaped cross-section, two-terminal type resonators C1 and C2 accommodated in the interior of the housing 1 together with corresponding terminal plates 2a and 2b and 3a and 3b. The resonator C1 is held between contact protuberances 4a and 4b respectively protruding in semi-spherical shape from central portions of the terminal plates 2a and 2b, and the resonator C2 is held between contact protuberances 5a and 5b also protruding in semi-spherical shape from central portions of the terminal plates 3a and 3b. Lead terminals 6a and 6b and 7a and 7b are respectively provided to extend through side walls 1a and 1b of the housing 1, with the lead terminal 6a being connected to the terminal plate 2a and the lead terminal 7a to the terminal plates 2b and 3a, while the lead terminals 6b and 7b are connected to the terminal plate 3b. The two-terminal type resonators C1 and C2 respectively function as a series resonance element and a parallel resonance element for constituting a ladder type filter as shown in FIG. 2.

However, the known ladder type filter as described above has several disadvantages. Since the terminal plates 2a, 2b, 3a and 3b are required for holding the two-terminal type resonators C1 and C2 therebetween, the number of parts involved is undesirably increased with consequent complication of the work of assembling the filter. Moreover due to the arrangement to hold the resonators C1 and C2 between the semi-spherical contact protuberances 4a and 4b and 5a and 5b respectively, the resistance of the filter against shocks is reduced, while resonators utilizing thickness vibration cannot be employed owing to the specific construction.

Figure 3:
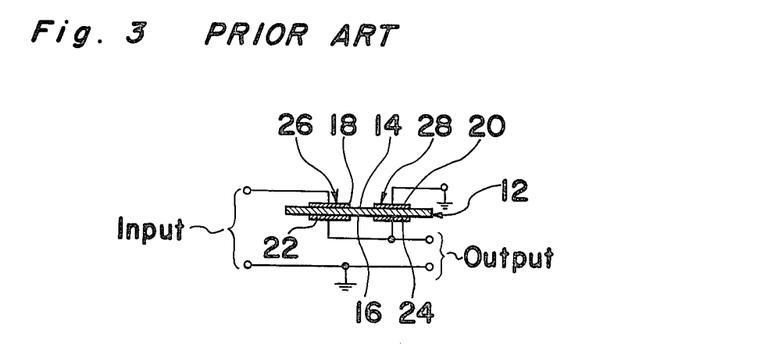
FIG. 3 is a schematic side sectional view showing the construction of a different type of conventional piezoelectric filter (already referred to)

For overcoming the disadvantages as described above, there has also been conventionally disclosed, for example, in Japanese Patent Publication Tokkyosho No. 39-8251, an electrical filter as shown in FIG. 3. The filter of FIG. 3 includes a comparatively thin plate or substrate 12 of piezoelectric material, at least two electrodes 18 and 20 provided in spaced relation from each other on one main surface 14 of the substrate 12, and corresponding electrodes 22 and 24 provided on the other main surface 16 of the substrate 12, with the electrodes 18 and 22 and 20 and 24 facing each other to respectively constitute electrode pairs. The total area of the electrodes 18 and 20 on the one main surface 14 is generally smaller than the area of that main surface 14, and each of the above electrode pairs functions together with the piezoelectric material held therebetween so as to constitute an electrical filter piezoelectric circuit element having resonators 26 and 28 independently vibrating in the same thickness mode at different fundamental resonance frequencies, and thus, the terminal plates 2a, 2b, 3a, 3b, etc. described as employed in FIG. 1 are omitted to provide the electrical filter of simple construction.

Figure 4:
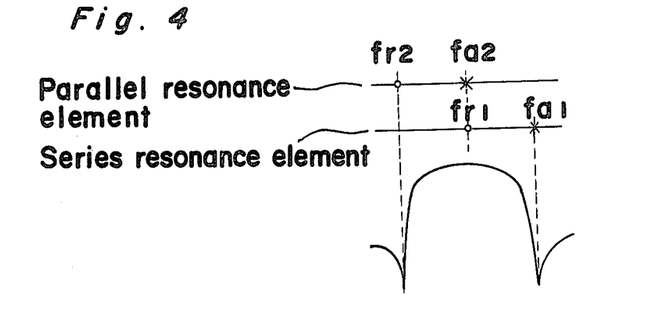
FIG. 4 is a diagram explanatory of frequency arrangements in a piezoelectric filter.

Incidentlly, in the case where the ladder type filter is to be constituted by the resonators 26 and 28 as described above, it is necessary to raise the resonance frequency fr1 of the series resonance element 26 higher than the resonance frequency fr2 of the parallel resonance element 28 of the ladder type filter, as is seen from FIG. 4, but due to the fact that both of the resonators 26 and 28 are formed on the single substrate 12 of piezoelectric material for vibration at the same thickness vibrating mode, it is difficult to raise the above resonance frequency fr1 higher than the resonance frequency fr2 to any large extent, with the result that the bandwidth of the ladder type filter is reduced.

SUMMARY OF THE INVENTION

Accordingly, an essential object of the present invention is to provide an improved piezoelectric filter in which, by forming at least one set of resonators including a multi-mode resonator of thickness-vibration energy-trapping type and a single resonator on one sheet of piezoelectric substrate and causing a gap between divided electrodes of the multi-mode resonator and the single resonator to function as a series resonance element and a parallel resonance element of the ladder type filter respectively, the desired passing bandwidth is readily obtained by only a slight correction of the frequency arrangement between the multi-mode resonator and single resonator through utilization of the fact that oblique or anti-symmetrical mode vibration of its multi-mode resonator has the resonance frequency and anti-resonance frequency higher than those in the case of the single resonator; by utilizing the fact that the electrostatic capacity between the divided electrodes of the multi-mode resonator is sufficiently smaller than the electrostatic capacity between the electrodes of the single resonator, a large capacity ratio is taken for increasing the attenuation amount at the cut-off region.

Another important object of the present invention is to provide an improved piezoelectric filter of the above described type which is simple in construction and accurate in functioning with a high reliability, and which can be manufactured on a large scale at low cost.

In accomplishing these and other objects, according to one preferred embodiment of the present invention, there is provided a piezoelectric filter for use in electrical and electronic equipment which includes a substrate of piezoelectric material. Electrode members are provided on first and second surfaces of the substrate so as to form at least one set of a multi-mode resonator and a single resonator of thickness-vibration energy-trapping type. The multi-mode resonator is a series resonance element of a ladder type filter through utilization of oblique or anti-symmetrical mode of said multi-mode resonator, while the single resonator is used as a parallel resonance element of the ladder type filter.

By the above arrangement according to the present invention, an improved piezoelectric filter which is capable of readily obtaining a desired passing bandwidth by only a slight adjustment of the frequency arrangement between the multi-mode resonator and single resonator and which has increased attenuation at a cut-off region has been advantageously presented through simple construction and at low cost, with substantial elimination of disadvantages inherent in the conventional piezoelectric filters of the kind.

BRIEF DESCRIPTION OF THE DRAWINGS

These and other objects and features of the present invention will become apparent from the following description taken in conjunction with the preferred embodiment thereof with reference to the accompanying drawings, in which.

Like parts are designated by like reference numerals throughout the accompanying drawings.

DETAILED DESCRIPTION OF THE INVENTION

Figure 5:
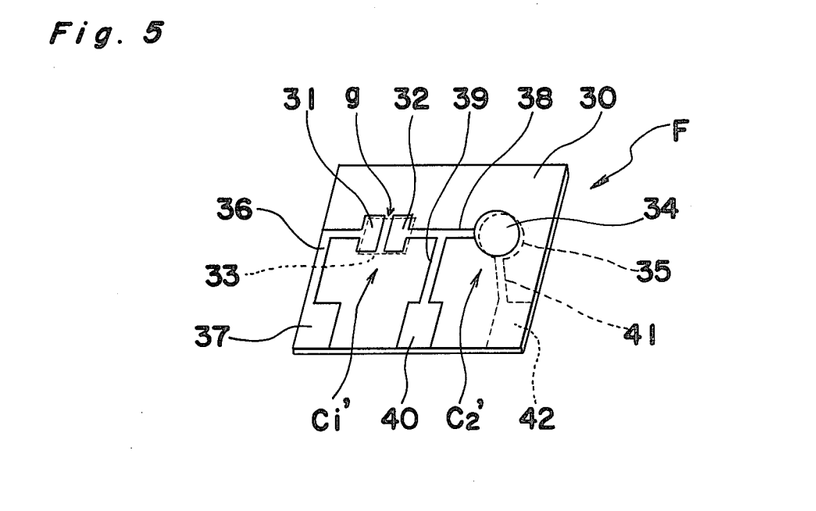
FIG. 5 is a perspective view showing the construction of a piezoelectric filter according to one preferred embodiment of the present invention.

Referring to the drawings, there is shown in FIG. 5 a piezoelectric filter F according to one preferred embodiment of the present invention. The filter F includes a piezoelectric ceramic substrate 30, for example, of square shape made of piezoelectric material selected from the group of $pb(Zr,Ti)O_3$ or the like through sintering process. A pair of rectangular divided electrodes 31 and 32 are formed on one surface or first surface of the substrate 30 and spaced from each other through a small gap g. A common electrode 33 of square shape formed on the other or second main surface of the substrate 30 in a position confronting said divided electrodes 31 and 32 so as to form an energy trapping multi-mode resonator C1' through utilization of thickness expansion, thickness vertical or thickness shear vibration of the piezoelectric ceramic substrate 30.

The substrate 30 further includes electrodes 34 and 35 respectively provided on the first and second main surfaces thereof to confront each other in a position sufficiently spaced from the multi-mode resonator C1' to be free from the influence of said resonator C1', for forming a single resonator C2' which vibrates in single mode.

Of the divided electrodes 31 and 32 of the above multi-mode resonator C1', the electrode 31 is electrically connected to a terminal electrode 37 formed adjacent to one corner on the first surface of said substrate 30 through an elongated connecting electrode 36, and the other electrode 32 and electrode 34 of the single resonator C2' are connected to each other by a connecting electrode 38 which is further connected through a connecting electrode 39 to another terminal electrode 40 also formed on the first surface of the substrate 30 in a position adjacent to one side of the substrate 30 spaced from the terminal electrode 37, while the electrode 35 of the single resonator C2' is connected through a connecting electrode 41 to a terminal electrode 42 formed on the second surface of the substrate 30. The common electrode 33 of the multi-mode resonator C1' is isolated on the second surface of the substrate 30 without being connected to the electrode 35 or terminal electrode 42 of the single electrode C2', and thus, the terminal electrodes 37, 40 and 42 are provided at the lower portion of the substrate 30 in FIG. 5 so as to be spaced approximately equally from each other.

Figure 6:
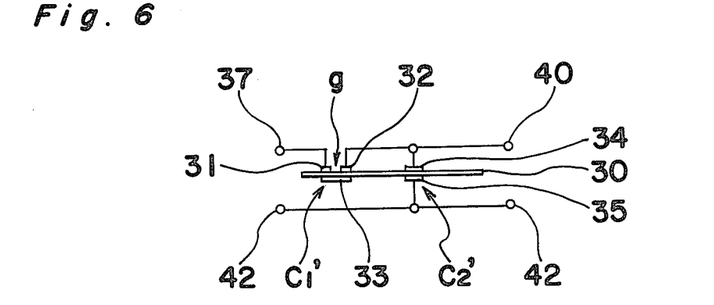
FIG. 6 is an electrical circuit diagram of the piezoelectric filter of FIG. 5.

In the piezoelectric filter F of the present invention having the construction as described above whose electrical circuit diagram is shown in FIG. 6, the gap g between the divided electrodes 31 and 32 of the multi-mode resonator C1' is such as to be a series resonance element connected the terminal electrodes 37 and 40, while the single resonator C2' is rendered to be a parallel resonance element connected between the terminal electrodes 40 and 42 to form the ladder type filter on the one sheet of piezoelectric ceramic substrate 30. In the above arrangement, since the resonance frequency fr1 and anti-resonance frequency fa1 (FIG. 4) of the oblique or anti-symmetrical mode of the above-mode filter C1' constituting the series resonance element are higher than the resonance frequency fr2 and anti-resonance frequency fa2 of the single resonator C2', desired passing bandwidth can be obtained, requiring almost no adjustments such as damping the vibration of the single resonator C2', for example, by a large mass load, etc.

On the other hand, in the ladder type filter employing the piezoelectric resonator, in order to increase the attenuation in the cut-off region, it is necessary to increase the ratio of the capacity of the parallel piezoelectric resonance element to the series piezoelectric resonance element, and when the multi-mode resonator C1' is employed for the series resonance element as in the present invention, since the divided electrodes 31 and 32 confront each other across thereof through the gap g, the capacity between the divided electrodes 31 and 32 is markedly decreased, thereby increasing the above ratio to a large extent, with a consequent increase in the attenuation at the cut-off region.

Figure 7:
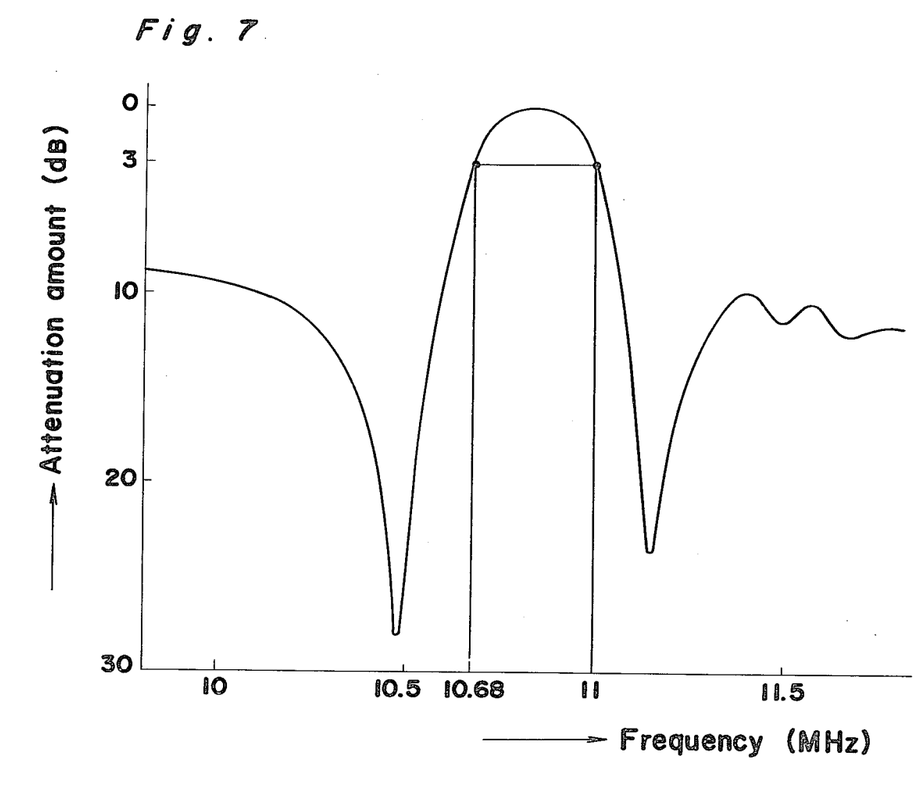
FIG. 7 is a graph explanatory of attenuation characteristics of the piezoelectric filter of FIG. 5.

By way of example, upon measurements of the attenuation characteristics by the use of the multi-mode resonator C1' vibrating in the oblique symmetrical mode with the resonance frequency fr1 of 10.827 MHz, anti-resonance frequency fa1 of 11.150 MHz, resonance resistance of 47Ω and capacity of 27 pF between the divided electrodes 31 and 32 for the series resonance element, and the single resonator C2' with the resonance frequency fr2 of 10.478 MHz, anti-resonance frequency fa2 of 10.959 MHz, resonance resistance of 10.5Ω and capacity of 84 pF between the confronting electrodes 34 and 35 for the parallel resonance element, the attenuation characteristics as shown in FIG. 7 are obtained.

As is seen from the attenuation characteristics diagram of FIG. 7, if the multi-mode resonator C1' and single resonator C2' having the values of fr1, fa1, fr2 and fa2 as described above are employed, and bandwidth at −3 dB will be represented by 11−10.68 MHz=320 KHz, with the attenuation amount at the cut-off region being approximately 10 dB.

In the foregoing, although the present invention has been described with reference to the fundamental embodiment thereof, it should be noted that the present invention is not limited in its application to such fundamental embodiment alone, but may be modified in various ways without exceeding the scope of the invention. For example, although not specifically shown, the arrangement may be modified in such a manner that, by forming a plurality of pairs of multi-mode resonators and single resonators on the one sheet of piezoelectric ceramic substrate 30, a piezoelectric filter including a plurality of stages of ladder type filters may be constituted by these pairs of multi-mode resonators and single resonators. Similarly, the common electrode 33 of the multi-mode resonator C1' may be replaced by an electrode divided into two portions confronting the divided electrodes 31 and 32. Furthermore, the piezoelectric ceramic substrate 30 described as made of $Pb(Zr,Ti)O_3$ or the like in the foregoing embodiment may be replaced by a piezoelectric plate composed of single crystal piezoelectric materials such as crystal, Rochelle Salt, etc.

As is clear from the foregoing description, according to the present invention, since it is arranged that the ladder type filter is constituted through utilization of the fact that the oblique symmetrical mode of the multi-mode resonator has a resonance frequency larger than that in the case of the single resonator, the frequency arrangement between the multi-mode resonator and single resonator is preliminarily set in an appropriate manner, and therefore, a desired passing bandwidth can be readily obtained by merely slightly adjusting the above frequency arrangement, while owing to the small capacity in the gap between the divided electrodes of the multi-mode resonator, the capacity of the series resonator element of the ladder type filter is much reduced, with a consequent increase of the attenuation in the cut-off region.

Moreover, since the multi-mode resonator and single resonator are constituted on the single sheet of piezoelectric substrate, terminal boards or the like as required in the conventional arrangements are not necessary, and thus, not only is the number of parts involved reduced to a large extent, but the assembly thereof is facilitated, with a marked reduction in the cost of the piezoelectric filter itself.

Figure 8:
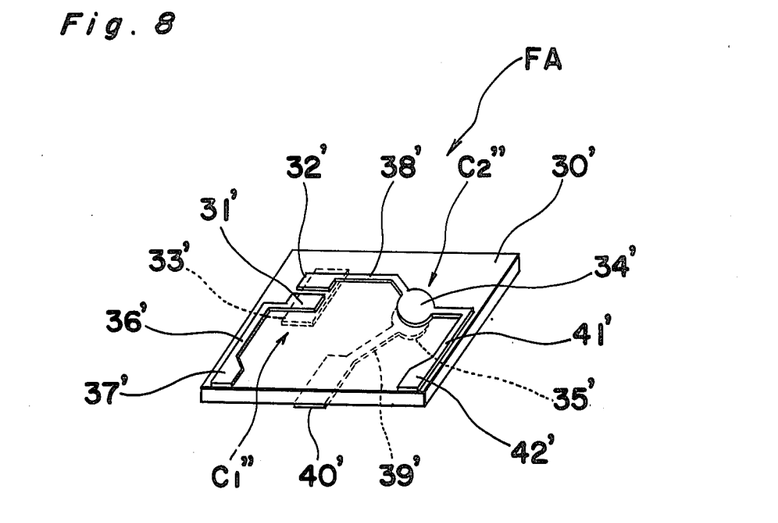
FIG. 8 is a view similar to FIG. 5, which particularly shows a modification thereof.
Figure 9:
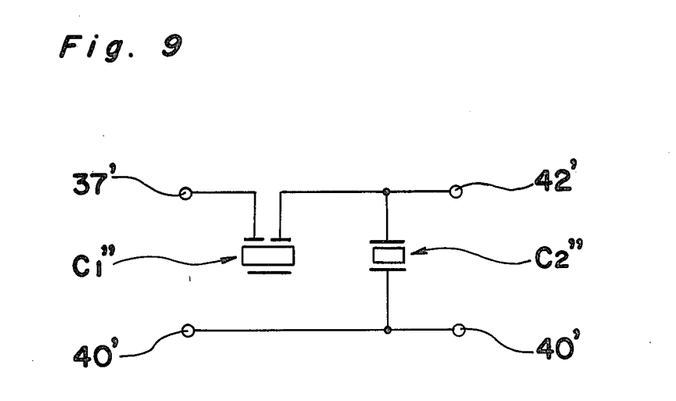
FIG. 9 is an electrical circuit diagram of the modified piezoelectric filter of FIG. 8.

Referring to FIGS. 8 and 9, there is shown a modification of the ladder type filter F of FIG. 5. In the modified ladder type filter FA of FIG. 8, a three-terminal multi-mode resonator C1" of thickness-vibration energy-trapping type and a two-terminal single resonator C2" which vibrates in a single mode are formed on the single sheet of the piezoelectric ceramic substrate 30' similar to the substrate 30 as described with reference to FIG. 5. The divided electrode 31' at the input side of the multi-mode resonator C1" is connected to the terminal electrode 37' through the connecting electrode 36', while the divided electrode 32' at the output side of the resonator C1" and one electrode 34' of the single resonator C2" are connected to each other by the connecting electrode 38' and further, to the terminal electrode 42' through the connecting electrode 41'. The other electrode 35' of the single resonator C2" is connected to the terminal electrode 40' through the connecting electrode 39' while the common electrode 33' is left unconnected as shown, so that the multi-mode resonator C1" is the series resonance element of the ladder type filter utilizing the oblique symmetrical mode of the resonator C1", with the single resonator C2" being the parallel resonance element as shown in FIG. 9.

Figure 10:
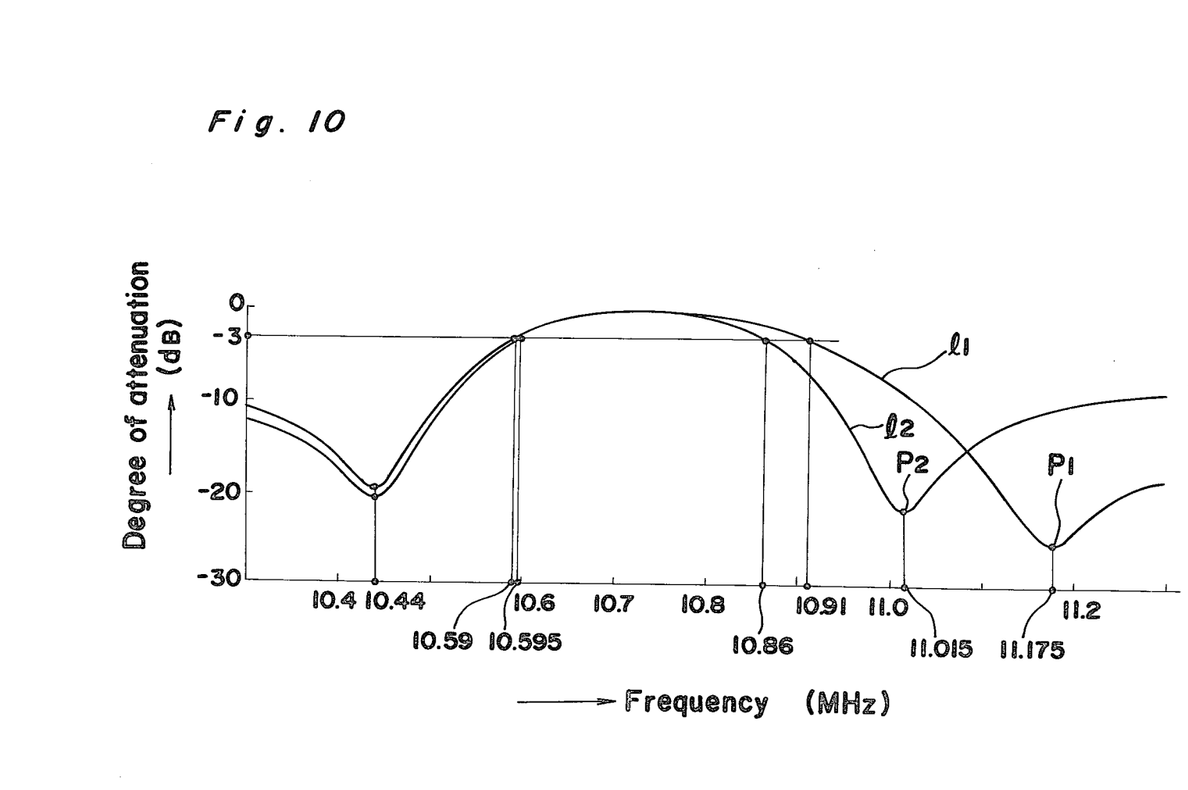
FIG. 10 is a graph explanatory of attenuation characteristics of the filters in FIGS. 8 and 11.

When the series resonance element and parallel resonance element of the filter are provided on the one sheet of the piezoelectric substrate 30' as described above, since the oblique symmetrical mode vibration has the resonance frequency and anti-resonance frequency higher than those in the case of the single resonator C2", comparatively large passing bandwidth is readily obtainable, but owing to the fact that both the multi-mode resonator C1" and single resonator C2" as described above are formed on the single sheet of piezoelectric ceramic substrate 30' for vibration in the same thickness expansion or thickness vibration mode, it is difficult to independently design the respective resonance frequencies and anti-resonance frequencies of the multi-mode resonator C1" and single resonator C2", and, for example, in the case where the arrangement is applied to a filter of an FM intermediate frequency amplifier with a central frequency of 10.7 MHz, the degree of attenuation at the high frequency region tends to be dull as shown by a curve l1 in FIG. 10.

In a further modification described hereinbelow with reference to FIGS. 11 and 12, it is intended to eliminate the problem as described above. The modified piezoelectric filter FB in FIG. 11 includes a capacitor Cp (further described below) connected between the input and output sides of the series resonance element of the ladder type filter having the respective multi-mode resonator and single resonator formed on the single sheet of piezoelectric substrate as the series resonance element and parallel resonance element. This lowers the anti-resonance frequency of the series resonance element which forms the pole at high frequency, thus improving the attenuation at high frequency, with an improved symmetrical nature of the attenuation characteristics.

In the modified piezoelectric filter FB in FIG. 11 utilizing for example, the ladder filter FA having the construction as described with reference to FIG. 8, a capacitor Cp is connected between the terminal electrode 37' conducted to the divided electrode 31' at the input side of the multi-mode resonator C1" and the terminal electrode 42' connected to the divided electrode 32' at the output side of the multi-mode resonator C1" through the electrode 34' of the single resonator C2" as shown.

Figure 12:
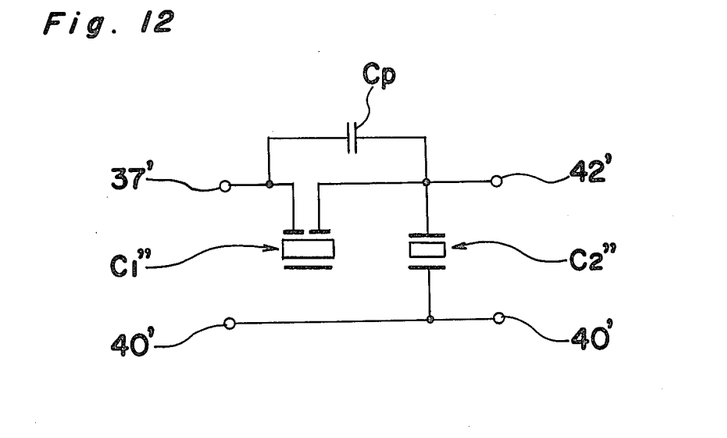
FIG. 12 is an electrical circuit diagram showing an equivalent circuit of the piezoelectric filter of FIG. 11.

By the above arrangement, the circuit construction is such that, as shown in FIG. 12, the input and output sides of the series resonance element of the ladder type filter having the multi-mode resonator C1" and single resonator C2" as the series and parallel resonance elements are bridged over or connected by the capacitor Cp, and thus, the anti-resonance frequency of the resonator utilizing the oblique symmetrical mode resonance of the above multi-mode resonator C1" constituting the high frequency side pole is lowered, with a consequent increase of the attenuation in the high frequency portion of the attenuation region of said piezoelectric filter.

By way of example, upon measurements of the attenuation characteristics by using the piezoelectric ceramic substrate 30' of PZT (lead zirconate titanate) group material 205 μm in thickness, with the length "a" and width "b" of the respective divided electrodes set as a=0.8 mm and b=0.45 mm, width of the gap g' between said divided electrodes 31' and 32' set as g'=0.2 mm, dimensions of the common electrode 33' set as 1.1 mm×0.8 mm, diameter of the electrodes 34' and 35' of the single resonator C2" set as 0.9 mm respectively, and capacity of the capacitor Cp set as 6.8 pF, characteristics as shown by a curve 12 in FIG. 10 are obtained.

Figure 11:
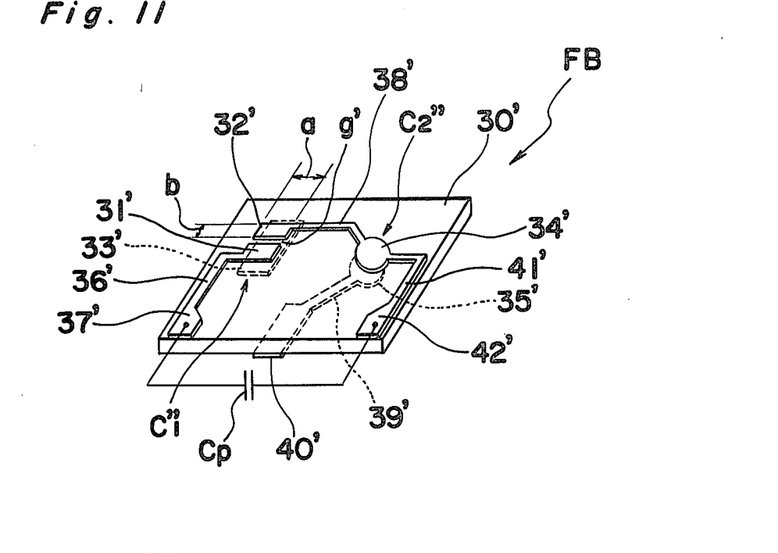
FIG. 11 is a view similar to FIG. 5, which particularly shows a further modification thereof.

As is seen from FIG. 10, in the ladder type filter FA of FIG. 8, the frequency at an attenuation pole P1 in the high frequency region is 11.175 MHz, while in the ladder type filter FB of FIG. 11, the frequency of an attenuation pole P2 of the high frequency region is moved toward the low frequency side to 11.015 MHz, with improved attenuation characteristics in the high frequency region. It is to be noted here that the capacity of the capacitor Cp is in the region approximately from several pF to 10 pF in the case of a central frequency of 10.7 MHz.

Meanwhile, by the movement of the attenuation pole from P1 to P2, the shape factor (=distance between the attenuation poles/3 dB bandwidth) of the ladder type filter of FIG. 8 is represented by $(11.175-10.44)/(10.91-10.595) \doteqdot 2.35$, while in the ladder type filter FB of FIG. 11, the shape factor becomes $(11.015-10.44)/(10.86-10.59) \doteqdot 2.13$, with improved symmetrical attenuation characteristics.

Needless to say, the embodiment as described in the foregoing may further be modified in various ways within the scope of the invention. For example, the discrete capacitor Cp described as connected between the electrode terminals 37' and 42' may be replaced by a capacitor (not shown) integrally formed with the multi-mode resonator C1", etc. on the piezoelectric substrate 30' in a known manner.

As is clear from the foregoing description, according to the arrangement of FIGS. 11 and 12, since the capacitor is connected between the input and output sides of the series resonance element of the ladder type filter constituted by the multi-mode resonator so as to lower the anti-resonance frequency of the series resonance element forming the high frequency side pole, the high frequency side attenuation degree of the ladder type filter is comparatively readily increased by merely connecting the capacitor, with a consequent improvement of the symmetrical nature of the attenuation characteristics. Moreover, since the anti-resonance frequency of the series resonance element is altered by the above capacitor, the task of designing the circuit for a desired frequency arrangement of the dual mode resonator and single resonator is facilitated.

Although the present invention has been fully described by way of example with reference to the accompanying drawings, it is to be noted that various changes and modifications will be apparent to those skilled in the art. Therefore, unless otherwise such changes and modifications depart from the scope of the present invention as defined in the appended claims, they should be construed as included therein.

What is claimed is:

1. A piezoelectric filter, comprising:
   a piezoelectric substrate having first and second main surfaces;
   electrode means disposed on said main surfaces and defining at least one set of piezoelectric resonators, said set including an energy-trapping multi-mode resonator and a thickness-vibration, energy-trapping type single resonator; and
   conductive means disposed on said main surfaces of said substrate defining an input terminal, an output terminal and a third terminal and defining conductive paths connecting said energy-trapping multi-mode resonator in series between said input terminal and said output terminal, and connecting said thickness-vibration energy-trapping type single resonator between said third terminal and one of said input terminal and said output terminal.

2. A piezoelectric filter as claimed in claim 1, wherein said electrode means include first and second electrodes disposed on said first main surface and spaced apart by a gap of predetermined width and further include a third electrode disposed on said second main surface in opposing, face-to-face relation to said first and second electrodes, said first, second and third electrodes defining said energy-trapping multi-mode resonator.

3. A piezoelectric filter as claimed in claim 1, further comprising capacitor means connected in parallel with said energy-trapping multi-mode resonator.

4. A piezoelectric filter as claimed in claim 3, wherein said capacitor means is integrally formed with said energy-trapping multi-mode resonator on said piezoelectric substrate.

5. A piezoelectric filter as claimed in claim 1 or claim 2, wherein said electrode means further define additional sets of resonators, each of said additional sets comprising an energy-trapping multi-mode resonator and a thickness-vibration, energy-trapping single resonator, said conductive means connecting said sets of resonators to each other to define respective stages of a ladder-type filter.

6. A piezoelectric filter as claimed in claim 1 or claim 2, wherein said piezoelectric substrate is made of a material selected from the $PB(Zr,Ti)O_3$ group.

7. A piezoelectric filter as claimed in claim 1 or claim 2, wherein said piezoelectric substrate is a single crystal of a piezoelectric material.

* * * * *